US 9,198,326 B2

(12) United States Patent
Sharma et al.

(10) Patent No.: US 9,198,326 B2
(45) Date of Patent: Nov. 24, 2015

(54) METHOD AND APPARATUS FOR REMOVING HEAT FROM ELECTRONIC DEVICES USING SYNTHETIC JETS

(71) Applicant: General Electric Company, Schenectady, NY (US)

(72) Inventors: Rajdeep Sharma, Niskayuna, NY (US); Stanton Earl Weaver, Broadalbin, NY (US); Charles Erklin Seeley, Niskayuna, NY (US); Mehmet Arik, Uskudar Istanbul (TR); Tunc Icoz, Schenectady, NY (US); Charles Franklin Wolfe, Jr., Albany, NY (US); Yogen Vishwas Utturkar, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 62 days.

(21) Appl. No.: 14/219,130

(22) Filed: Mar. 19, 2014

(65) Prior Publication Data
US 2014/0202657 A1 Jul. 24, 2014

Related U.S. Application Data

(63) Continuation of application No. 12/683,826, filed on Jan. 7, 2010, now Pat. No. 8,695,686.

(51) Int. Cl.
*H01L 23/467* (2006.01)
*H05K 7/20* (2006.01)
(Continued)

(52) U.S. Cl.
CPC .............. *H05K 7/20154* (2013.01); *F21K 9/13* (2013.01); *F21V 29/63* (2015.01); *H01L 23/467* (2013.01);
(Continued)

(58) Field of Classification Search
CPC ............... H01L 23/467; H01L 2924/0002; H01L 2924/00; H05K 7/20163; H05K 7/20154; H05K 7/20409; F21K 9/13; F21V 29/63; F21V 29/83; F21V 29/507; F21Y 2101/02; Y10T 29/4935; F04D 23/006; F04D 29/602; F04B 43/046; F04B 45/04
USPC ............................................... 417/413.2, 437
See application file for complete search history.

(56) References Cited

U.S. PATENT DOCUMENTS 4,715,435 A * 12/1987 Foret ............................ 165/120
5,338,164 A * 8/1994 Sutton et al. ............... 417/413.2
(Continued)

FOREIGN PATENT DOCUMENTS

EP 2116730 A2 11/2009
WO 2007056209 A2 5/2007
WO 2008048493 A2 4/2008

OTHER PUBLICATIONS

PCT International Search Report and Written Opinion for International Application No. PCT/US2010/052611, dated Jan. 26, 2011.

*Primary Examiner* — Tho V Duong
(74) *Attorney, Agent, or Firm* — Ziolkowski Patent Solutions Group, SC; Jean K. Testa

(57) ABSTRACT

An apparatus for removing heat comprises a heat sink having a cavity, and a synthetic jet stack comprising at least one synthetic jet mounted within the cavity. At least one rod and at least one engaging structure to provide a rigid positioning of the at least one synthetic jet with respect to the at least one rod. The synthetic jet comprises at least one orifice through which a fluid is ejected.

15 Claims, 5 Drawing Sheets

(51) Int. Cl.
*F21K 99/00* (2010.01)
*F21V 29/63* (2015.01)
*F04B 17/00* (2006.01)
*F21Y 101/02* (2006.01)
*F21V 29/507* (2015.01)
*F21V 29/83* (2015.01)

(52) U.S. Cl.
CPC ........ H05K 7/20172 (2013.01); H05K 7/20409 (2013.01); *F21V 29/507* (2015.01); *F21V 29/83* (2015.01); *F21Y 2101/02* (2013.01); *H01L 2924/0002* (2013.01); *Y10T 29/4935* (2015.01)

(56) References Cited

U.S. PATENT DOCUMENTS

| | | | |
|---|---|---|---|
| 6,457,654 B1 | 10/2002 | Glezer et al. | |
| 6,588,497 B1 | 7/2003 | Glezer et al. | |
| 7,252,140 B2 | 8/2007 | Glezer et al. | |
| 7,263,837 B2 | 9/2007 | Smith | |
| 7,990,705 B2* | 8/2011 | Bult et al. | 361/694 |
| 8,066,410 B2 | 11/2011 | Booth et al. | |
| 8,120,908 B2* | 2/2012 | Arik et al. | 361/694 |
| 8,453,715 B2 | 6/2013 | Arik et al. | |
| 2006/0196638 A1 | 9/2006 | Glezer et al. | |
| 2007/0119573 A1 | 5/2007 | Mahalingam et al. | |
| 2007/0119575 A1 | 5/2007 | Glezer et al. | |
| 2007/0139938 A1 | 6/2007 | Petroski et al. | |
| 2008/0137289 A1 | 6/2008 | Arik et al. | |
| 2008/0310110 A1 | 12/2008 | Arik et al. | |
| 2009/0084866 A1 | 4/2009 | Grimm et al. | |
| 2009/0109625 A1 | 4/2009 | Booth et al. | |
| 2010/0110630 A1 | 5/2010 | Arik et al. | |
| 2010/0258270 A1* | 10/2010 | Arik et al. | 165/80.3 |
| 2011/0139893 A1 | 6/2011 | Wetzel et al. | |
| 2011/0141691 A1* | 6/2011 | Slaton et al. | 361/690 |

* cited by examiner

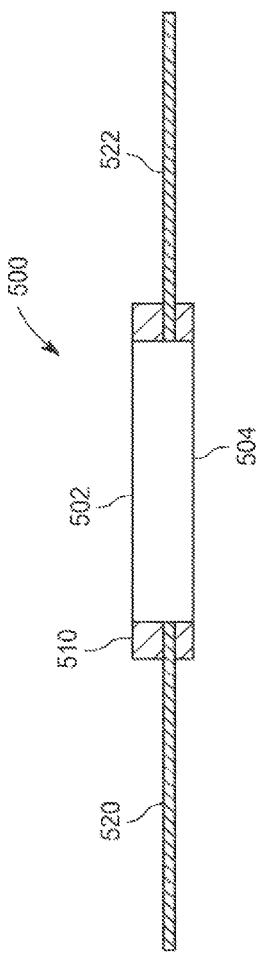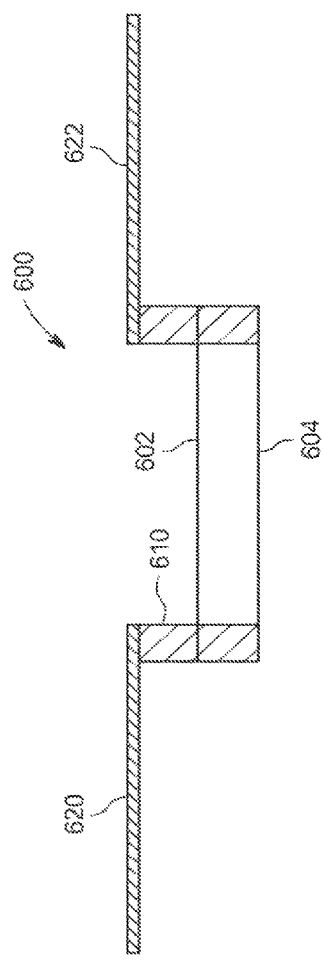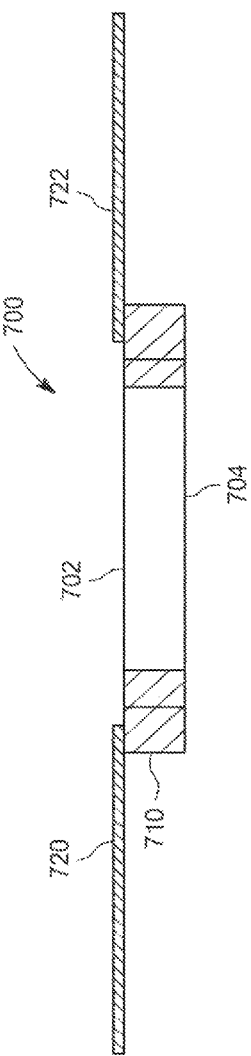

METHOD AND APPARATUS FOR REMOVING HEAT FROM ELECTRONIC DEVICES USING SYNTHETIC JETS

CROSS-REFERENCE TO RELATED APPLICATION

The present application is a continuation of and claims priority to U.S. patent application Ser. No. 12/683,826, filed Jan. 7, 2010, the disclosure of which is incorporated herein.

STATEMENT REGARDING FEDERALLY SPONSORED RESEARCH & DEVELOPMENT

This invention was made with Government support under contract number DE-FC26-08NT01579 awarded by The United States Department of Energy. The Government has certain rights in the invention.

BACKGROUND

The subject matter disclosed herein relates generally to cooling techniques, and more specifically to methods and apparatus for removing heat from electronic devices using synthetic jets.

Most electronic devices generate heat during operation. The heat generated needs to be removed for preserving the performance of, and avoiding damage to the electronic devices. For example, in various electronic circuit chips, such as microprocessors installed on mother-boards of computers, heat removal is critical for the reliable operation and performance of the microprocessor and its surrounding components. According to another example, the performance and integrity of Light Emitting Diodes (LEDs) and associated driver electronics are highly temperature dependent.

LED based luminaires continue to gain importance in comparison to incandescent lamps, due to the higher efficacy of LEDs in converting input electric power to light. The development and widespread use of high brightness LEDs and their application to the lighting industry require the development of advanced thermal management systems. LEDs require higher drive currents and power densities, thereby increasing the heat output in case of luminaires. Smaller can (or enclosure) sizes are critical for the acceptance of LED based luminaires both from the viewpoint of structural and cosmetic requirements. Accordingly, advanced cooling in a confined space is a typical requirement in high lumen LED based lighting applications.

While thermal management and distribution is critical to the reliability and functionality of the LEDs, in general, a higher rate of heat removal from increasingly smaller spaces is a common requirement in today's electronic devices. Although several conventional techniques have been employed for effective thermal management, most techniques suffer from high costs, higher can size requirements in case of luminaires, for example, among other disadvantages.

Accordingly, a need exists for an improved method and apparatus for providing cooling in electronic device environments.

BRIEF DESCRIPTION

According to an embodiment of the present invention, an apparatus for removing heat is provided. The apparatus comprises a heat sink having a cavity, and a synthetic jet stack comprising at least one synthetic jet mounted within the cavity. At least one rod and at least one engaging structure is configured to provide a rigid positioning of the at least one synthetic jet with respect to the at least one rod. The synthetic jet comprises at least one orifice through which a fluid is ejected.

According to another embodiment, a method for assembling a synthetic jet stack in a heat sink is provided. At least one arm extension extends from the synthetic jet. The method includes removably attaching at least one rod to a base of a cavity in the heat sink. At least one engaging structure is installed to the at least one rod. At least one arm extension is installed on to the at least one rod such that the movement of the arm extension along the rod is restricted by the at least one engaging structure in at least one direction.

DRAWINGS

These and other features, aspects, and advantages of the present invention will become better understood when the following detailed description is read with reference to the accompanying drawings in which like characters represent like parts throughout the drawings, wherein:

FIG. 5 is a cross section view of a synthetic jet according to an embodiment of the invention.

FIG. 6 is a cross section view of a synthetic jet according to an embodiment of the invention.

FIG. 7 is a cross section view of a synthetic jet according to an embodiment of the invention.

DETAILED DESCRIPTION

As used herein, an element or function recited in the singular and proceeded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

Figure 1:
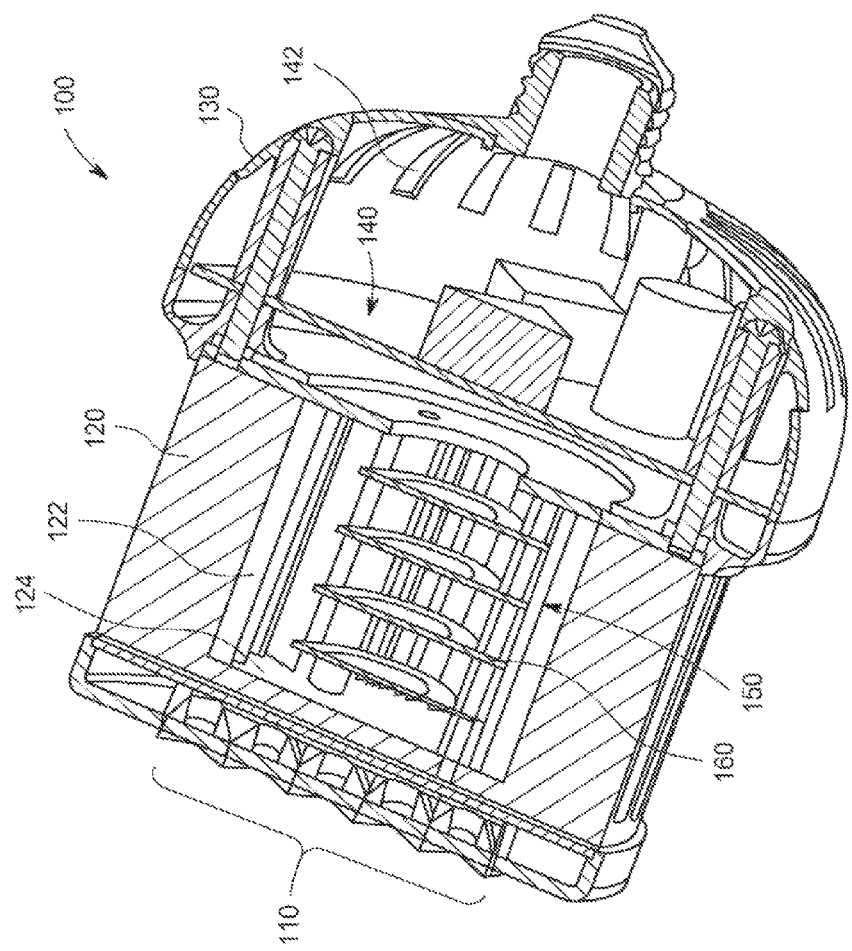
FIG. 1 is a partially cut view illustrating a LED luminaire comprising a synthetic jet stack based cooling apparatus according to an embodiment of the invention.

FIG. 1 illustrates a luminaire 100 incorporating a synthetic jet stack 150 for removing heat, according to an embodiment of the invention. The luminaire 100 comprises one or more light emitting diodes or LEDs 110, a heat sink 120, and power electronics 130 encased within a luminaire can 140. The luminaire can 140 further comprises exhaust vents 142 to provide an escape route for heat generated (e.g. the hot air) within the luminaire 100. The heat sink 120 comprises heat sink fins 122 and a cavity 124 for housing the synthetic jet stack 150. The synthetic jet stack 150 comprises one or more synthetic jet(s) 160.

Figure 2:
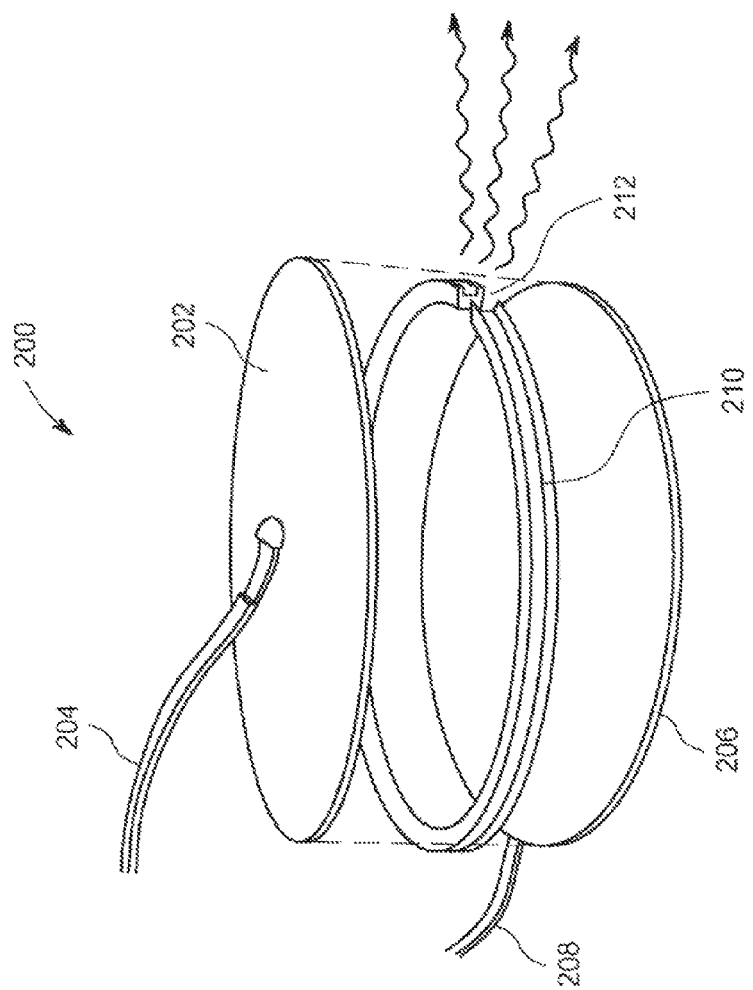
FIG. 2 is an exploded view of a synthetic jet used in the synthetic jet stack based cooling apparatus of FIG. 1.

FIG. 2 illustrates an exploded view of a synthetic jet 200, for example, similar to the synthetic jet 160 of FIG. 1. The synthetic jet 200 includes a first piezoelectric disk 202 coupled to a first electrical connection 204, a second piezoelectric disk 206 coupled to a second electrical connection 208, and a wall 210 having at least one orifice 212 for intake and release of a jet of ambient fluid and/or air. As used herein, the term "synthetic jet" refers to the synthetic jet device, for example as illustrated by FIG. 2 and/or as generally known in the art. For the purpose of this discussion, the fluid (or air) flow emanating from the synthetic jet is referred to as "jet," unless mentioned otherwise.

The wall 210 is attached substantially along the periphery of the first and the second piezoelectric disks 202, 206 to define a cavity 214 in the synthetic jet 200. In one embodiment, the wall 210 includes an elastomeric material, for example, an elastomeric material, such as a silicone, for an optimal operation of the synthetic jet 200. Compliant materials for the wall 210 include foams, and various other materials known generally in the art. The piezoelectric disks 202, 206 are energized by electric current delivered by the electrical connections 204, 208, to generate a physical movement (e.g. vibration) in the piezoelectric disks 202, 206 respectively. The piezoelectric disks 202, 206 are energized to change the volume of the cavity 214 between the disks 202, 206 at an adjustable frequency, and eject or force a fluid contained within (e.g. air) out through the orifice 212, or multiple orifices (not shown in FIG. 2).

In general, synthetic jets (e.g. synthetic jet 200), are zero net mass flow devices that comprise a cavity or volume of air enclosed by a flexible structure and a small orifice through which air is forced as illustrated in FIG. 2. More specifically, the synthetic jet 200 structure is induced to deform in a periodic or a pre-determined manner causing a corresponding suction and expulsion of the air through the orifice 212. Synthetic jets transfer heat effectively by improving local convection cooling. The synthetic jet 200, for example, imparts a net positive momentum to the air. During each vibration cycle of the synthetic jet 200, the momentum to the air is manifested as a self-convecting dipole that emanates away from the orifice 212. The vortex dipole so manifested impinges on a surface to be cooled, such as an LED circuit board assembly, or the heat sink (e.g. heat sink 120). The impingement of air on heated components results in removal of heat from the heated components by way of forced-convection. In steady state conditions, this impingement mechanism develops circulation patterns near the heated components and facilitates mixing of hot air within an electronic device (e.g. the can 140 of the luminaire 100) and an ambient fluid (e.g. air from outside the luminaire). Overall, synthetic jets provide significantly enhanced cooling over and above cooling achieved by natural convection. For example, in one embodiment, usage of synthetic jets enhances cooling by a factor of 10 as compared to the cooling provided by natural convention.

Figure 3:
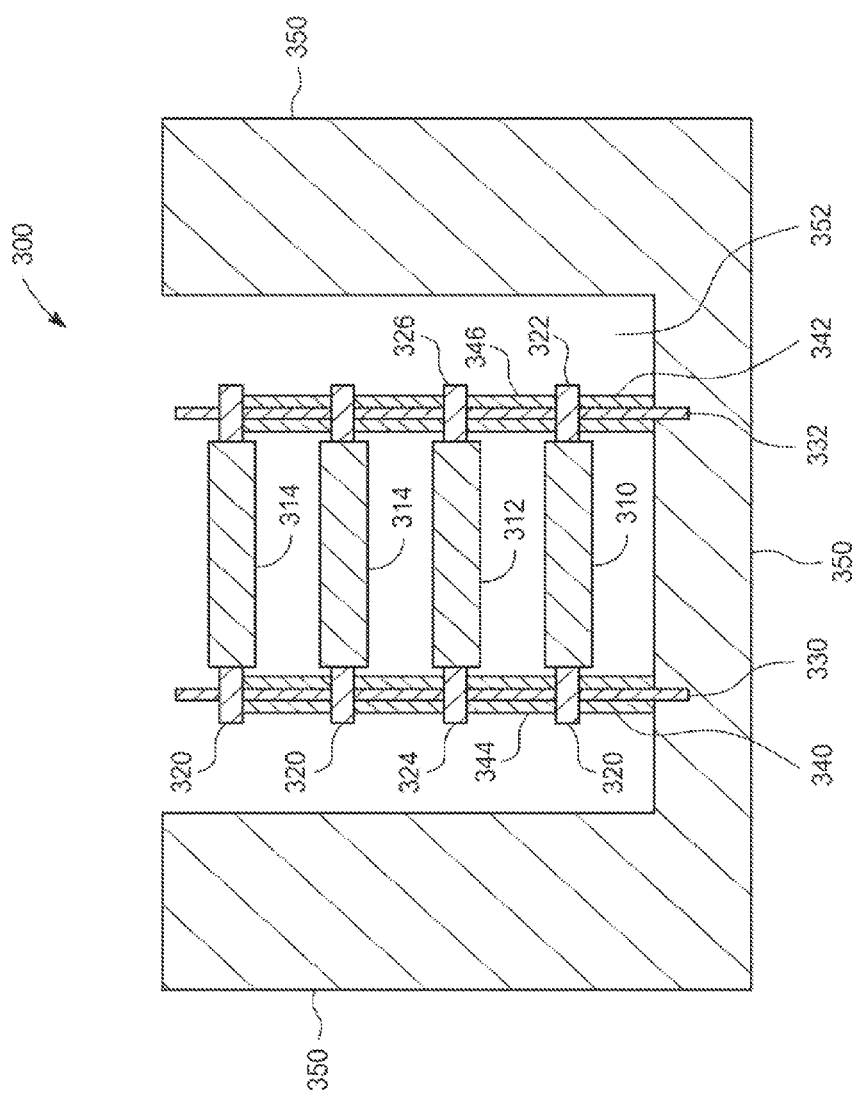
FIG. 3 is a partial cross section view of the synthetic jet stack based cooling apparatus according to an embodiment of the invention.

FIG. 3 illustrates a front view of a synthetic jet stack 300, similar to the synthetic jet stack 150 of FIG. 1. The synthetic jet stack 300 is located within a cavity 352 of a heat sink 350. The synthetic jet stack 300 comprises multiple synthetic jets, 310, 312, 314, 316 in a stack configuration. The synthetic jet 310 has a first arm extension 320 and a second arm extension 322 for providing a rigid mechanical coupling with a first rod 330 and a second rod 332, respectively. While in the embodiment illustrated by FIG. 3 the synthetic jet 310 includes two arm extensions 320 and 322 to provide a rigid mechanical coupling with the rods 330 and 332, in other embodiments, the synthetic jet 310 may include only one arm extension. In yet other embodiments, three or more arm extensions are included in the synthetic jet 310 for mechanical coupling with a corresponding number of rods. The rod 330 provides a rigid positioning of the synthetic jet 310 with respect to the heat sink 350. For example, the rod 330 is a threaded rod, and the rod 330 is screwed in to a surface of the heat sink 350, for example, the base of the heat sink 350, to provide the rigid positioning, as illustrated. According to other embodiments, the rod 330 is attached to another component of an electronic device (not shown in FIG. 3), for example, a luminaire. Spacers 340 and 342 are installed on the rods 330 and 332 (by sliding the spacer(s) into position on the rod) to provide a desired gap between the arm extensions 320 and 322 and the heat sink 350, respectively. Spacer 344 is installed on the rod 330 to provide a desired gap between the arm extension 320 and the arm extension 324. Similarly, spacer 346 is positioned on the rod 332 to provide a desired gap between the arm extension 322 and the arm extension 326. Thus, the spacers 344 and 346 provide a configured separation between the consecutively stacked synthetic jets (e.g. 310 and 312) or between a synthetic jet (e.g. 310) and the surface of the heat sink 350. Accordingly, the synthetic jet stack 300 apparatus described above avoids direct interface of the synthetic jet stack 300 or its components with fins (not shown in FIG. 3) of the heat sink 350. Avoiding significant direct interface with the heat sink 350 fins preserves high efficiency of the heat sink 350.

According to an embodiment, a method for assembling a synthetic jet stack for example the synthetic jet stack 300, in the heat sink 350 includes attaching the rod 330 to a base in a cavity of the heat sink 350. The first spacer 340 is installed on to the rod 330, and the first arm extension 320 is installed thereafter. The movement of the first arm extension 320 along the rod 330 is restricted by the first spacer 340 in at least one direction, for example, in a direction of the first spacer 340 (e.g. vertically downward in FIG. 3). The spacer 344 is then installed, followed by the arm extension 324. An iterative process may be used to assemble or make a synthetic jet stack, for example the synthetic jet stack 300. Advantageously, the iterative nature of the assembly process provides for a simple, modular, scalable, and compact synthetic jet stack. Advantageously, the synthetic jet stack mounting mechanism described does not require attachment of the synthetic jets (e.g. 310) to the heat sink 350.

Figure 4:
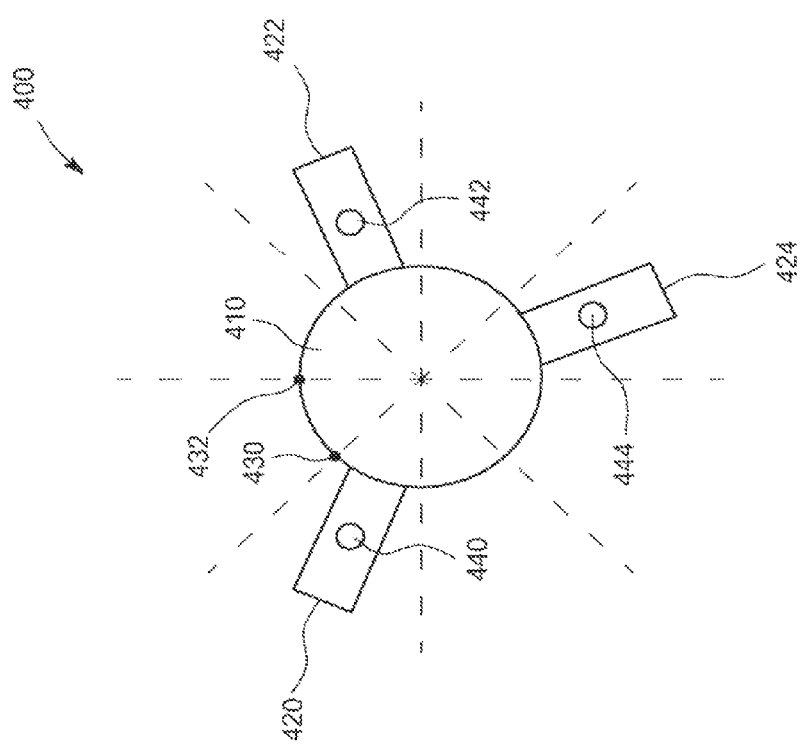
FIG. 4 is a top view of a synthetic jet with arm extensions, according to an embodiment of the present invention.

FIG. 4 illustrates a top view of synthetic jet stack 400 according to another embodiment of the invention. The synthetic jet stack 400 comprises a synthetic jet 410 having three arm extensions 420, 422, 424. The arm extension 420 includes a hole 440 for installing the arm extensions on to a rod (e.g. rod 330 of FIG. 3), by passing the rod through the hole 440. The arm extensions 422 and 424 include holes 442 and 444 respectively for inserting and fitting with similar rods. The synthetic jet 410 comprises multiple orifices 430, 431, 432, 433, 434, 435 as illustrated. The orifices 430-435 and the arm extensions 420, 422, 424 are configured to be offset such that the arm extension 420, 422, 424 do not obstruct a jet flow emanating from the orifices 430-435. Preventing any obstruction of the jet flows from the orifices 430-435 provides for optimal efficiency of convection cooling by the synthetic jets (e.g. the synthetic jet 410).

With respect to FIGS. 1, 3 and 4, those skilled in the art will appreciate that while reference is made to a rod, a spacer and an arm extension mechanism to position a synthetic jet stack rigidly within a portion of an electronic device (e.g. heat sink cavity of a luminaire), various other engaging structures as generally known in the art may equally be employed to provide a rigid positioning of synthetic jet stacks (e.g. synthetic jet stack 400) in an equivalent manner without deviating from the scope and spirit of the present invention. According to one embodiment, for example, arm extensions from synthetic jets do not have holes, e.g. hole 440, as illustrated by FIG. 4. Instead, the arm extensions include a click-fit mechanism as the engaging structure, to provide structural rigidity to the synthetic jet with respect to a rod, similar to the rod 330. According to several other embodiments, the engaging structure 340 includes, without limitation, a clip, a latch, a click fit notch (along with a corresponding receptacle in the rod 330), an adhesive (for attaching shaped arm extensions to the rod 330). According to another embodiment, rod(s) are not screwed into a heat sink surface as illustrated in FIG. 3, instead the rods are attached to the heat sink surface using an adhesive. Many such similar and other obvious variations of mechanisms for positioning synthetic jet stacks within electronic devices, such that the mechanisms do not obstruct the jet flow emanating from the synthetic jets, and such that the mechanisms do not require a significant interface with the heat sink, will occur readily to those skilled in the art. All such obvious mechanism variations are included within the scope and spirit of the invention.

FIG. 5 illustrates a cross section view of a synthetic jet 500, similar to the synthetic jet 310 of FIG. 3. The synthetic jet 500 includes a first piezoelectric disk 502 and a piezoelectric second disk 504 and a wall 510, similar to the wall 210 of FIG. 2. Arm extensions 520 and 522 extend from the wall 510 for coupling with, for example, two rods similar to the rods 330 and 332. The arm extensions 520 and 522 are mechanically coupled to the wall 510, as illustrated by FIG. 5. In other embodiments, the wall 510 and the arm extensions 520 and 522 are manufactured as a single component.

The arm extensions 520, 522 include material having a desired stiffness coefficient for an optimal operation of the synthetic jet 500. Those skilled in the art will appreciate that a low stiffness of the extension arms 520, 522 may lead to oscillations of the synthetic jet 500 itself, while a high stiffness of the extension arms 520, 522 may lead to a change in the natural frequency of the synthetic jet 500, resulting in loss of cooling performance at the operating frequency. According to the embodiment illustrated by FIG. 5, the arm extensions 520, 522 include a material having a low modulus elastomeric material, for example, a silicone, configured to have minimal impact on the frequency of the synthetic jet 500 operation.

As discussed, the configuration illustrated by FIG. 5, the arm extensions 520, 522 extend from the wall 510 to provide a rigid structural support to the synthetic jet 500. The rigid structural support provided by the configuration illustrated in FIG. 5 avoids clamping of the first disk 502 and the second disk 504 of the synthetic jet 500. Prevention of clamping advantageously ensures that the bending motion of the synthetic jet of the synthetic jet 500 is not impeded, as compared to configurations in which the synthetic jet 500 is clamped to the arm extensions 520 and/or 522. The bending motion of the synthetic jet 500 is critical for its cooling performance.

Specifically, as illustrated by FIG. 5, the wall 510 is positioned substantially within the periphery of the first piezoelectric disk 502 and the second piezoelectric disk 504. According to another embodiment, FIG. 6 illustrates a synthetic jet 600 which includes a first piezoelectric disk 602 and a second piezoelectric disk 604 and a wall 610, similar to the wall 210 of FIG. 2. Arm extensions 620 and 622 extend from the wall 610. As illustrated by FIG. 6, the wall 610 is configured to protrude horizontally outwards from the periphery of the first piezoelectric disk 602 and the second piezoelectric disk 604. According to yet another embodiment, FIG. 7 illustrates a synthetic jet 700 which includes a first piezoelectric disk 702 and a second piezoelectric disk 704 and a wall 710, similar to the wall 210 of FIG. 2. Arm extensions 720 and 722 extend from the wall 710. As illustrated by FIG. 7, the wall 710 is configured to protrude vertically outwards from the periphery of the first piezoelectric disk 702 and the second piezoelectric disk 704.

Various embodiments disclosed herein provide several advantages. According to certain embodiments, the synthetic jet stacks provide cooling devices inside a heat sink (of an electronic device) cavity, without a physical attachment of the synthetic jets or their accessories to the heat sink fins. Certain other embodiments provide a simple, modular, scalable and reliable synthetic jet package in a heat sink, without affecting the cooling performance of the synthetic jets. Various embodiments further enable the use of a variable number of synthetic jets with a variable number of orifices providing jets in various directions and patterns, including even or uneven patterns in a vertical and/or horizontal direction.

According to various other advantages, embodiments disclosed provide a compact and low cost packaging solution. The embodiments discussed herein enable active cooling by synthetic jets and address low reliability concerns associated with high temperature operation conditions of LEDs and other similar devices. While the discussions with respect to the figures draw reference to LED based luminaires, those skilled in the art will readily appreciate that the various embodiments of synthetic jet stacks disclosed herein may be equivalently applied similarly to heat removal application in several other types of electronic devices/ environments.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity).

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A cooling apparatus comprising:
   a synthetic jet stack comprising a plurality of synthetic jets, each synthetic jet including:
      a pair of opposing piezoelectric active members;
      a wall positioned between the pair of opposing piezoelectric active members, wherein the wall has formed therein at least one orifice to eject fluid; and
      at least one support member extending outwardly from the wall of the synthetic jet and having an opening therein;
   at least one rod extending through the support member openings of the synthetic jets; and
   at least one spacer disposed between each adjacent pair of synthetic jets to separate the synthetic jets in the synthetic jet stack from one another.

2. The cooling apparatus of claim 1 wherein the at least one support member is mechanically coupled to the wall of the synthetic jet.

3. The cooling apparatus of claim 1 wherein the wall protrudes horizontally outwards from a periphery of the piezoelectric active members.

4. The cooling apparatus of claim 1 wherein the wall protrudes vertically outwards from a periphery of the piezoelectric active members.

5. The cooling apparatus of claim 1 wherein the at least one rod is oriented so as not to obstruct the at least one orifice of each synthetic jet.

6. The cooling apparatus of claim 1 wherein the at least one spacer is slidable over the at least one rod.

7. The cooling apparatus of claim 1 further comprising a heat sink having a base, wherein each of the at least one rod is secured to the base of the heat sink.

8. The cooling apparatus of claim 7 wherein a spacer is disposed between the synthetic jet stack and the base of the heat sink to separate the synthetic jet stack from the base.

9. The cooling apparatus of claim 7 wherein the synthetic jet stack is positioned within a cavity of the heat sink.

10. The cooling apparatus of claim 7 wherein the at least one support member provides a rigid mechanical coupling with the at least one rod, and wherein the rod provides a rigid positioning of the synthetic jet stack with respect to the heat sink.

11. The cooling apparatus of claim 1 wherein the piezoelectric active members are conifgured to vibrate in response to an electrical current.

12. The cooling apparatus of claim 1 wherein the wall comprises an elastomeric material.

13. The cooling apparatus of claim 1 wherein the at least one support member comprises a low modulus elastomeric material.

14. A cooling apparatus comprising:
  a synthetic jet stack comprising a plurality of synthetic jets arranged in a vertical orientation, wherein each synthetic jet includes:
    a pair of opposing piezoelectric active members;
    a wall positioned between the pair of opposing piezoelectric active members to define a cavity within the synthetic jet, wherein the wall includes at least one orifice formed therein to eject fluid upon actuation of the piezoelectric active members; and
    a plurality of arm extensions extending outwardly from the wall of the synthetic jet, each of the plurality of arm extensions including a hole formed therein;
  a plurality of rods each extending a height of the synthetic jet stack or taller, with each of the plurality of rods extending through a number of aligned holes of respective arm extensions in plurality of synthetic jets; and
  a plurality of spacers disposed between each adjacent pair of synthetic jets to separate the synthetic jets in the synthetic jet stack from one another, with each spacer being positioned on a respective rod.

15. The cooling apparatus of claim 14 further comprising a heat sink having a base, wherein each of the plurality of rods is secured to the base of the heat sink.

\* \* \* \* \*